US009006674B2

(12) United States Patent
Yu et al.

(10) Patent No.: US 9,006,674 B2
(45) Date of Patent: Apr. 14, 2015

(54) RADIOACTIVE RAY DETECTING APPARATUS

(75) Inventors: Juhyun Yu, Mito (JP); Naoyuki Yamada, Hitachinaka (JP); Shinichi Inoue, Ryugasaki (JP); Akihiro Hiruta, Hitachi (JP); Chihiro Ohkubo, Mito (JP)

(73) Assignee: Hitachi Aloka Medical, Ltd., Tokyo (JP)

( * ) Notice: Subject to any disclaimer, the term of this patent is extended or adjusted under 35 U.S.C. 154(b) by 202 days.

(21) Appl. No.: 13/809,903

(22) PCT Filed: Jul. 15, 2011

(86) PCT No.: PCT/JP2011/066196
§ 371 (c)(1),
(2), (4) Date: May 29, 2013

(87) PCT Pub. No.: WO2012/008568
PCT Pub. Date: Jan. 19, 2012

(65) Prior Publication Data
US 2013/0241016 A1 Sep. 19, 2013

(30) Foreign Application Priority Data

Jul. 15, 2010 (JP) ................................. 2010-160582

(51) Int. Cl.
*H01L 25/00* (2006.01)
*H01L 31/02* (2006.01)
*H01L 31/0224* (2006.01)
*H01L 31/115* (2006.01)
*G01T 1/24* (2006.01)

(52) U.S. Cl.
CPC .. *H01L 31/02016* (2013.01); *H01L 31/022408* (2013.01); *H01L 31/115* (2013.01); *G01T 1/243* (2013.01)

(58) Field of Classification Search
CPC ........ G01T 1/2928; G01T 1/24; H01L 31/115
USPC ...................................................... 250/370.1
See application file for complete search history.

(56) References Cited

U.S. PATENT DOCUMENTS 4,622,467 A * 11/1986 Britten et al. ................. 250/389
6,236,051 B1    5/2001 Yamakawa et al.
(Continued)

FOREIGN PATENT DOCUMENTS

JP    11-281747 A    10/1999
JP    11-337646 A    12/1999
(Continued)

*Primary Examiner* — David Porta
*Assistant Examiner* — Mindy Vu
(74) *Attorney, Agent, or Firm* — Volpe and Koenig, P.C.

(57) ABSTRACT

A radioactive ray detecting apparatus provides for reduction of the dead area or region where radioactive rays cannot be detected, even if disposing the radioactive ray detectors to be dense or crowded. The radioactive ray detecting apparatus satisfies the following relationships, when assuming that distance between semiconductor elements is "XG1", while the distance from the semiconductor element of one of the radioactive ray detectors up to the semiconductor element of other radioactive ray detectors is "XG2", and distance between the semiconductor elements alighted in a Y-direction is "YG1", and a horizontal pitch of a predetermined pixel pitch to be used as the radioactive ray detector is "a" and a vertical pitch thereof is "b", width of a surface of each of plural numbers of semiconductor elements is "c" and length thereof is "d", respectively:

$c = a - (XG1 + XG2)/2$ $d = b - YG1 = 2e + (n-2)f$

6 Claims, 5 Drawing Sheets

(56) References Cited

U.S. PATENT DOCUMENTS

| | | |
|---|---|---|
| 2008/0007895 A1 | 1/2008 | Shimoirisa et al. |
| 2009/0152439 A1 | 6/2009 | Goto |
| 2010/0270462 A1* | 10/2010 | Nelson et al. .............. 250/252.1 |

FOREIGN PATENT DOCUMENTS

| | | |
|---|---|---|
| JP | 2007-333547 A | 12/2007 |
| JP | 2009-147147 A | 7/2009 |

* cited by examiner

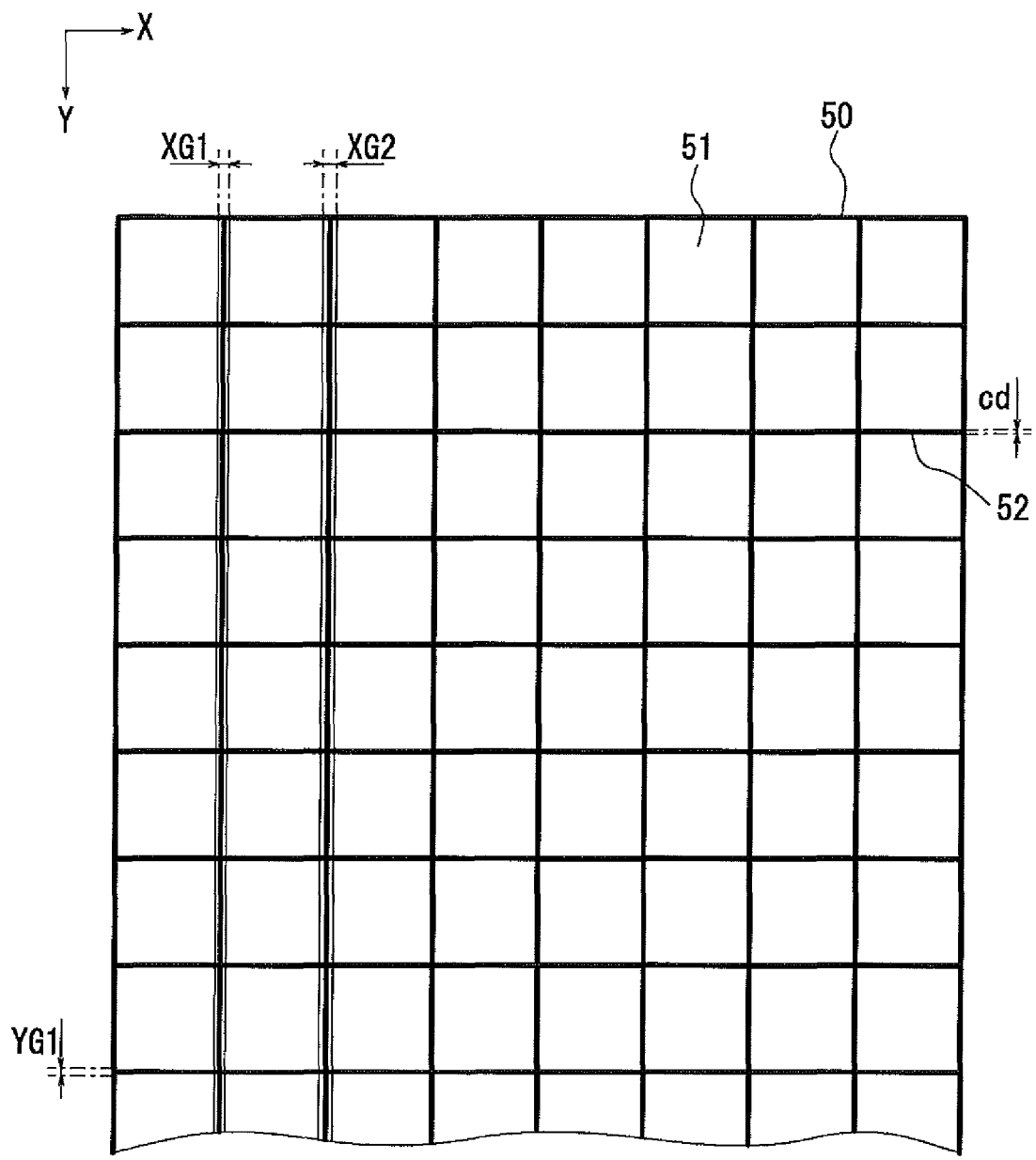

RADIOACTIVE RAY DETECTING APPARATUS

TECHNICAL FIELD

This application relates to and claims priority from Japanese Patent Application No. 2010-160582 filed on Jul. 15, 2010, the entire disclosure of which is incorporated herein by reference.

The present invention relates to a radioactive ray detecting apparatus. In particular, the present invention relates to a radioactive ray detecting apparatus with applying an Edge-On type radioactive ray detector therein, for detecting radiations of gamma (γ) rays, X rays, etc.

BACKGROUND OF THE INVENTION

As a conventional radioactive ray detector is already known a radioactive ray detector, being constructed with providing layers therein, wherein plural numbers of common electrodes, plural number of semiconductor cells and plural numbers of electrodes are laminated with, such as, a common electrode, a semiconductor cell, an electrode, a semiconductor cell, a common electrode . . . , between two (2) pieces of frames, while one of the frames is fixed with the other frame by a pin (for example, see the Patent Document 1).

With the radioactive ray detector described in the Patent Document 1, since a pair of semiconductor cells neighboring with each other in the horizontal direction share the common electrode, it is possible to reduce areas or regions where the radioactive rays cannot be detected, comparing to that of the conventional art, and thereby to increase an efficiency of detecting the radioactive rays.

PRIOR ART DOCUMENTS

Patent Documents

[Patent Document 1] U.S. Pat. No. 6,236,051.

BRIEF SUMMARY OF THE INVENTION

Problem(s) to be Solved by the Invention

However, the radioactive ray detector according to the Patent Document 1 is constructed with laminating the plural numbers of constituent elements, i.e., the common electrodes, the semiconductor cells, etc. In such a radioactive ray detecting apparatus applying such radioactive ray detector therein, since an error in sizes owned by each of the constituent elements is added to, every time when the constituent element is piled up, therefore it is difficult to reduce the areas where the radioactive rays cannot be detected (for example, an area where the common electrode lies, etc.), while aligning the plural numbers of semiconductor cells at high accuracy.

Accordingly, an object of the present invention is to provide a radioactive ray detecting apparatus, for enabling to reduce the areas where the radioactive rays cannot be detected, even when the radioactive ray detector is disposed to be dense or crowded.

Means for Solving the Problem(s)

According to the present invention, for accomplishing the object mentioned above, there is provided a radioactive ray detecting apparatus equipped with Edge-On type radioactive ray detectors, each having a substrate, on which plural numbers of semiconductor elements enabling to detect radioactive rays are fixed, wherein each of said plural numbers of semiconductor elements has plural numbers intra-element pixel regions on a surface thereof, on which said radioactive rays are incident, said plural numbers of radioactive ray detectors are aligned along with an X-direction in such disposition that said substrates of the plural numbers of radioactive ray detectors are in parallel with, respectively, when defining said X-direction and a Y-direction on a plane view, each of said radioactive ray detectors has said plural numbers of semiconductor elements, which are aligned in said Y-direction, respectively, on one surface and other surface of said substrate, when assuming that distance between said semiconductor elements, being provided with putting said substrate therebetween, is "XG1", while distance from said semiconductor element of one of said radioactive ray detectors up to said semiconductor element of other radioactive ray detectors, facing to said semiconductor element and neighboring with said one radioactive ray detector, is "XG2", and distance between said semiconductor elements alighted in said Y-direction is "YG1", and further assuming that a horizontal pitch of a predetermined pixel pitch to be used as said radioactive ray detector is "a" and a vertical pitch thereof is "b", width of a surface of each of said plural numbers of semiconductor elements, upon which the radioactive rays are incident, is "c" and length thereof is "d", and among said plural numbers of intra-element pixel regions of respective one of said plural numbers of semiconductor elements, assuming that length of the intra-element pixel regions, which are positioned at both end portions of respective one of said plural numbers of semiconductor elements, is "e", respectively, and length of each one of said plural numbers of intra-element pixel regions, being put between the intra-element pixel regions, which are positioned at both end portions of each of said plural numbers of semiconductor elements, is "f", respectively, the following relationships are satisfied:

$$c = a - (XG1 + XG2)/2$$

$$d = b - YG1 = 2e + (n-2)f$$

$$e = b/n - YG1/2$$

$$f = b/n \text{ (however, "}n\text{" is a positive integer)}.$$

Also, in the radioactive ray detecting apparatus, as described in the above, it is preferable that the following relationships are satisfied:

$$Cd \geq XG1$$

$$Cd \geq XG2$$

when assuming that scepter width of a matched collimator, which can be provided on the radioactive ray detector, is "Cd".

Also, in the radioactive ray detecting apparatus, as described in the above, it is preferable that the relationship XG1=XG2 is satisfied.

Also, in the radioactive ray detecting apparatus, as described in the above, it is preferable that the relationship XG1=XG2=YG1 is satisfied.

Also, in the radioactive ray detecting apparatus, as described in the above, wherein each of said plural numbers of semiconductor elements has (n−2) pieces of grooves on a surface perpendicular to the surface, upon which said radioactive rays are incident, and also has an electrode, between said plural numbers of grooves, and on a surface opposite to said one surface, and thereby enabling to define "n" pieces of said intra-element pixel regions.

Also, in the radioactive ray detecting apparatus, as described in the above, wherein said plural numbers of semiconductor elements can be provided on one surface of said substrate and on other surface thereof, respectively, with using said substrate as a symmetric surface.

Effect(s) of the Invention

With the radioactive ray detecting apparatus, according to the present invention, it is possible to provide the radioactive ray detecting apparatus, for enabling to reduce the areas where the radioactive rays cannot be detected, even when the radioactive ray detectors are disposed to be dense or crowded.

BRIEF DESCRIPTION OF THE SEVERAL VIEWS OF THE DRAWING

FIG. 5 is an upper view for showing the radioactive ray detector equipped with a matched collimator thereon, according to the embodiment of the present invention.

EMBODIMENT(S) FOR CARRYING OUT THE INVENTION

Figure 1:
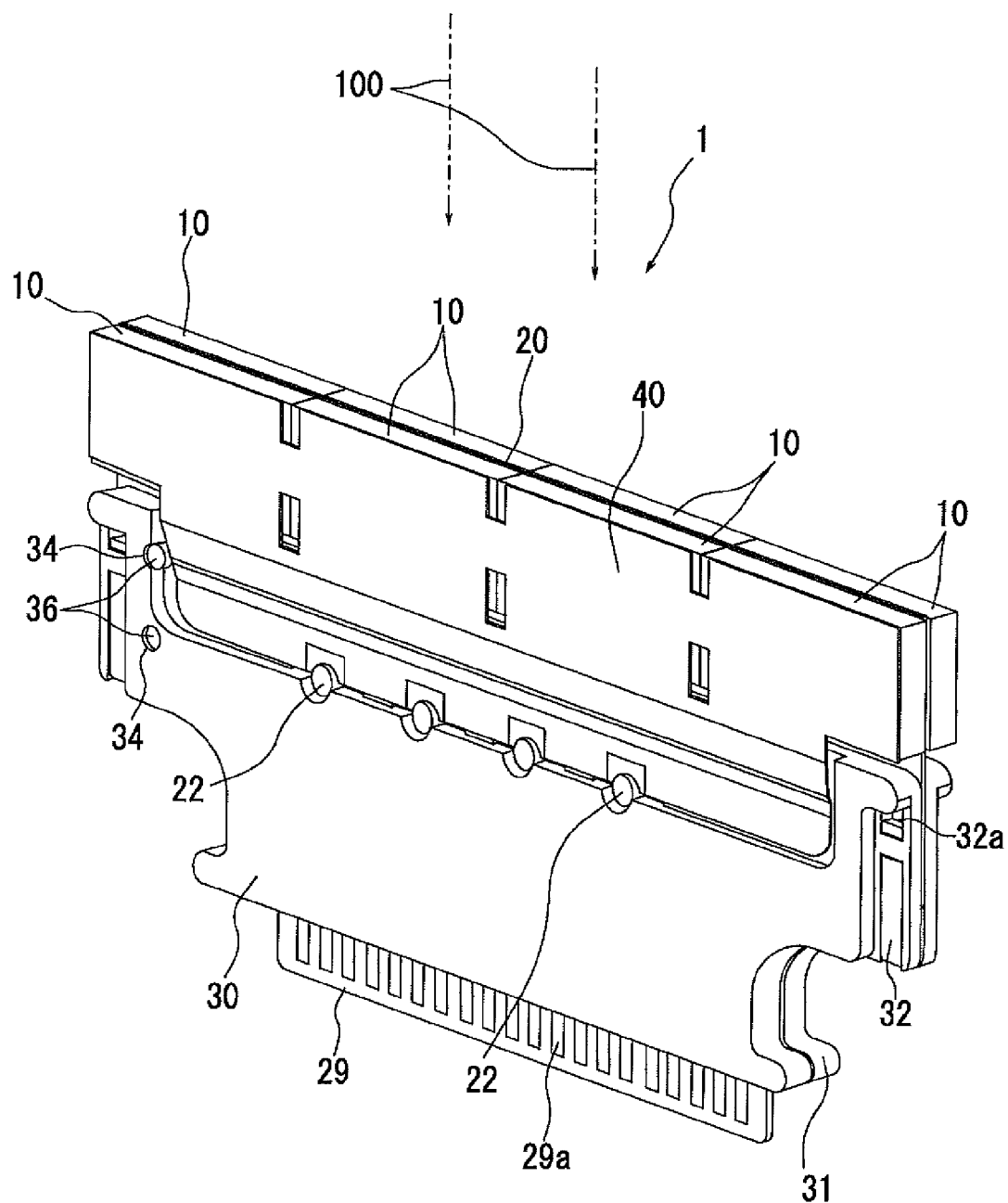
FIG. 1 is a perspective view of a radioactive ray detector, according to an embodiment of the present invention.

FIG. 1 shows an outlook of a perspective view of a radioactive ray detector, according to an embodiment of the present invention.

(Outlook of Structure of Radioactive Ray Detector 1)

A radioactive ray detector 1, according to the embodiment of the present invention, has a substrate 20, on which plural numbers of semiconductor elements 10 are fixed, each being able to detect gamma (γ) rays, X rays, etc. and is the radioactive ray detector showing a card-like configuration. In FIG. 1, radioactive rays 100 are incident upon a paper surface, along a direction from an upper to a lower. Thus, the radioactive rays 100 propagate along with a direction directing from the semiconductor elements 10 of the radioactive ray detector 1 to card holders 30 and 31, and reach to the radioactive ray detector 1. And, on the radioactive ray detector 1, the radioactive rays are incident upon side surfaces of the semiconductor elements 10 (i.e., the surface facing to the above in FIG. 1). Accordingly, the side surfaces of the semiconductor elements 10 define an incident surface for the radioactive rays 100. The radioactive ray detector having the incident surface for the radioactive rays 100 on the side surfaces of the semiconductor elements 10, in this manner, is called an Edge-On type radioactive ray detector, in the present embodiment.

However, the radioactive ray detector 1 can be used as the radioactive ray detector 1 for use of the radioactive ray detecting apparatus, which may be construed by aligning plural numbers of the radioactive ray detectors 1, for detecting the radioactive rays 100 through a collimator having plural numbers of openings, through which the radioactive rays propagating along with a specific direction (for example, a direction toward to the radioactive ray detector 1) pass (for example, a matched collimator, a pin-hole collimator, etc.)

By referring to FIG. 1, the radioactive ray detector 1 comprises a pair of semiconductor elements, each being able to detect the radioactive rays 100, a thin substrate 20, card holders 30 and 31 for supporting the substrate 20 by pinching at neighboring portions of the pair of semiconductor elements 10. And, in the present embodiment, four (4) sets of the pair of semiconductor elements 10 are fixed on the substrate 20, at the position of pinching the substrate 20. Thus, the pair of semiconductor elements 10 of each set are fixed on one surface of the substrate 20 and the other surface thereof, respectively, at the positions being symmetric with respect to the surface of the substrate 20.

Also, the substrate 20 is supported, being held between the card holders 30 and 31. The card holders 30 and 31 are formed to have the same configuration to each other, wherein a projecting portion 36, which the card holder 31 has, is inserted into a hole with groove, which the card holder 30 has, and also a projecting portion 36 (not shown in the figure), which the card holder 30 has, is inserted into a hole with groove (not shown in the figure), which the card holder 31 has, and thereby supporting the substrate 20.

Also, an elastic member mounting portion 32 and a concave portion 32a are portions where an elastic member for pressing the radioactive ray detector 1 towards a radioactive ray detector stand, thereby to fix it, when the radioactive ray detector 1 is inserted into the radioactive ray detector stand for supporting plural numbers of radioactive ray detectors 1 therein. Further, the radioactive ray detector stand has a connector, into which a card edge portion 29 can be inserted, and the radioactive ray detector 1 is electrically connected with a control circuit, as an external electric circuit, a power source ling from an outside, and a ground line, etc., by inserting the card edge portion 29 thereof into the connector, so as to electrically connect the connector with a pattern 29a.

Also, the radioactive ray detector 1, on the opposite side of the substrate 20 of the pair of semiconductor elements 10, further comprises a flexible substrate 40, which has wiring patterns for electrically connecting an electrode pattern of each semiconductor element 10 and plural numbers of substrate terminals 22, respectively (however, not shown the electrode pattern on the surface of the semiconductor element, on the side opposite to the substrate 20), and the wiring patterns on the side of the flexible substrate 40 facing to the semiconductor element 10).

The flexible substrate 40 is provided for both, on the one side and the other side of the pair of semiconductor elements 1, respectively (however, in the present embodiment, the flexible substrates 40 are provided, respectively, for both the one and the other of four (4) sets of the semiconductor elements 10). And, one ends of the plural numbers of wiring patterns of the flexible substrate 40 are electrically connected with the substrate terminals 22, respectively, at plural numbers of flexible lead connecting portions of the card holders 30 and 31. In more details, one end of the wiring patter of the flexible substrate 40 is connected on an element surface of the semiconductor element 10 by a conductive adhesive, etc. And, the other end of that wiring pattern is electrically connected on a terminal surface of the substrate terminal 22 with applying the conductive adhesive, etc. However, the substrate terminal 22 is provided on the surface of the substrate 20, and is electrically connected with the wiring pattern of the substrate 20.

(Details of Substrate 20)

The substrate 20 is formed by putting a thin substrate (for example, a glass epoxy substrate, such as, FR4, i.e., Flame Retardant Type 4, etc.), on the surface of which a conductive thin film of a conducive material, such as, a metal conductor, etc., (for example, a copper foil) between insulation layers made of an insulating material, such as, a solder resist, etc., and thereby to have a flexibility. However, the substrate 20 is formed to have length of around 40 mm, in the width direction, i.e., in a long direction, for example. And, the substrate 20 is formed to have length of around 20 mm, in a short direction from an end portion of a wide portion up to an end portion of a portion, the width of which is narrowed. Herein, since the substrate 20 defines an area or region where the radioactive ray cannot detect, then the area or region of the substrate 20, being put between the pair of semiconductor elements 10, results into a dead or insensible area. Therefore, it is preferable that the thickness of the substrate 20 be thin. In more details, it is preferable that the substrate 20 has the thickness equal to or less than 0.4 mm. In the present embodiment, as an example thereof, the substrate 20 has the thickness of 0.2 mm.

Also, the substrate 20 has a first wiring pattern, which is electrically connected with the electrode pattern of the semiconductor element 10. The first wiring pattern is so formed that it is electrically connected with the pattern 29a of the card edge portion 29. Further, the substrate 20 has a second wiring pattern for electrically connecting the substrate terminal 22 and the pattern 29a of the card edge portion 29. With this, on the substrate 20, the electrode of the surface of the semiconductor element 10, facing to the substrate 20, is electrically connected with the pattern 29a of the card end portion through the first wiring patter of the substrate 20. Also, the electrode on the surface of the semiconductor element 10 opposite to the substrate 20 is electrically connected with the pattern 29a of the card edge portion 29 via the wiring pattern of the flexible substrate 40, the substrate terminal and the second wiring pattern of the substrate 20. Herein, it is assumed that the electrode of the semiconductor element 10 on the side facing to the substrate 20 is an anode electrode, while the electrode of the semiconductor element 10 on the side opposite to the substrate 20 is a cathode electrode. In this instance, signals from the anode electrode and signals from the cathode electrode are outputted to an external electric circuit, via the pattern 29a of the card edge portion 29.

(Details of Semiconductor Element 10)

Figure 2:
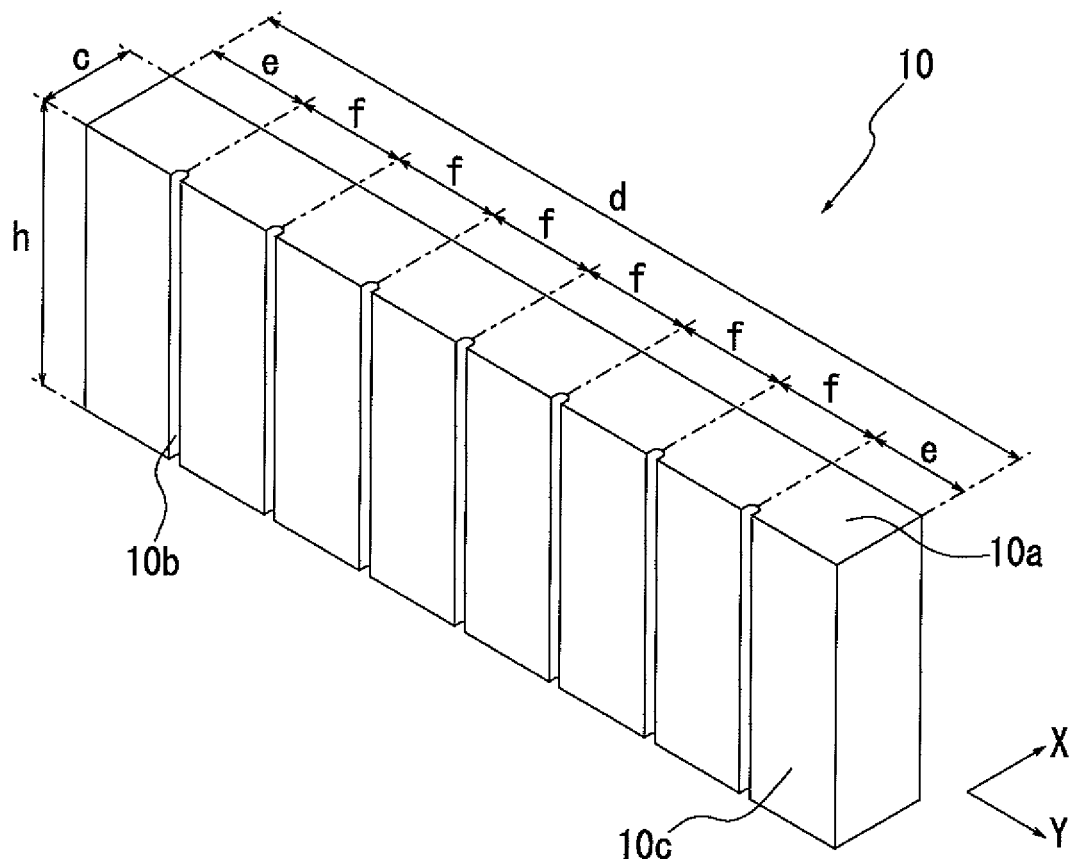
FIG. 2 is a perspective view of a semiconductor element, according to the embodiment of the present invention.

FIG. 2 is a outlook of a perspective view of the semiconductor element, which is equipped with the radioactive ray detector according to the present embodiment.

The semiconductor element 10 is formed into a rectangular shape, approximately, and is provided with electrode patterns (not shown in the figure) on an element surface 10c and an element surface opposite to that element surface 10c, respectively. The radioactive ray enters from an end portion of each semiconductor element 10 and travels within the semiconductor element 10 directing to the card edge portion 29. Also, in the semiconductor element 10 according to the present embodiment, plural numbers of grooves 10b are provided on the element surface, i.e., one surface perpendicular to the surface, upon which the radioactive ray enters. Width of the groove 10b is, for example, 0.2 mm.

On the surface of the semiconductor element 10, upon which the radioactive rays enter, an area or region divided by an imaginary perpendicular line, from each groove 10b, to the surface on opposite side to that, on which the groove 10b is provided, and an area or region divided by that imaginary perpendicular line and the end portion of the semiconductor element 10 are presented, as an intra-element pixel region, in the present embodiment. The semiconductor element 10 has (n−1) pieces of grooves 10b, and electrodes between/among plural numbers of grooves 10b, and on a surface opposite to the element surface 10c, and whereby a (n) pieces of the intra-element pixel regions. Each of plural numbers of the intra-element pixel regions corresponds to an effective one (1) piece of pixel for detecting the radioactive rays. With this, one (1) piece of the semiconductor element 10 has plural numbers of pixels.

And, as an example, one (1) set of the radioactive ray detector 1 has eight (8) pieces of semiconductor elements 10 (i.e., the four (4) sets of the pair of semiconductor elements 10), and in case where one (1) piece of semiconductor element 10 has the eight (8) pieces of intra-element pixel regions, respectively, the one (1) set of the radioactive ray detector 1 results to have a resolution power of 64 pixels. With increasing/decreasing the number of the grooves 10b, it is possible to increase/decrease the pixel number of one (1) piece of semiconductor element 10.

Herein, it is assumed that width of a surface of the semiconductor element 10, upon which the radioactive rays enter, is "c", length of the surface thereof, upon which the radioactive rays enter, is "d", and height of the semiconductor element 10 is "h", respectively. If defining an X-direction on a plane view and a Y-direction perpendicular to the X-direction, the width is defined in the X-direction, while the length in the Y-direction. However, as an example, the width "c" is about 1.2 mm, the length "d" is about 11.2 mm, and the height is about 5 mm.

And, among the plural numbers of intra-element pixel regions 10a of the semiconductor element 10, it is assumed that length of the intra-element pixel regions 10a, locating at both end portions of the plural numbers of semiconductor elements 10 respectively, is "e", and that respective length of plural number of intra-element pixel regions 10a, being put between the intra-element pixel regions 10a locating at both end portions of the semiconductor element 10, is "f". Thus, in the direction of length of the semiconductor element 10, the distance from an end portion of the semiconductor element 10 up to a first groove 10b is defined to be "e", and the distance from one groove 10b up to other groove 10b neighboring with that one groove 10b is "f". Accordingly, an equation of the following relationship is established: i.e., "d=2e+(n−2)f (however, "n" is a positive integer)" In the example shown in FIG. 2 is shown an example of "n=8", in other words, an example where eight (8) pieces of the intra-element pixel regions 10a are formed in one (1) piece of the semiconductor element 10.

As a material for building up the semiconductor element 10 can be applied CdTe. Also, the semiconductor element 10 should not be limited to the CdTe element, as far as it can detect the radioactive rays, such as, the gamma (γ) rays, etc. For example, as the semiconductor element 10 can be also applied a CdZnTe (CZT) element, or a compound semiconductor element, such as, a $HgI_2$ element, etc. However, the semiconductor elements 10 are electrically connected with wiring patterns of the substrate 20, respectively, through a conductive adhesive, such as, Ag paste, etc.

(Abstract of Radioactive Ray Detecting Apparatus)

Figure 3:
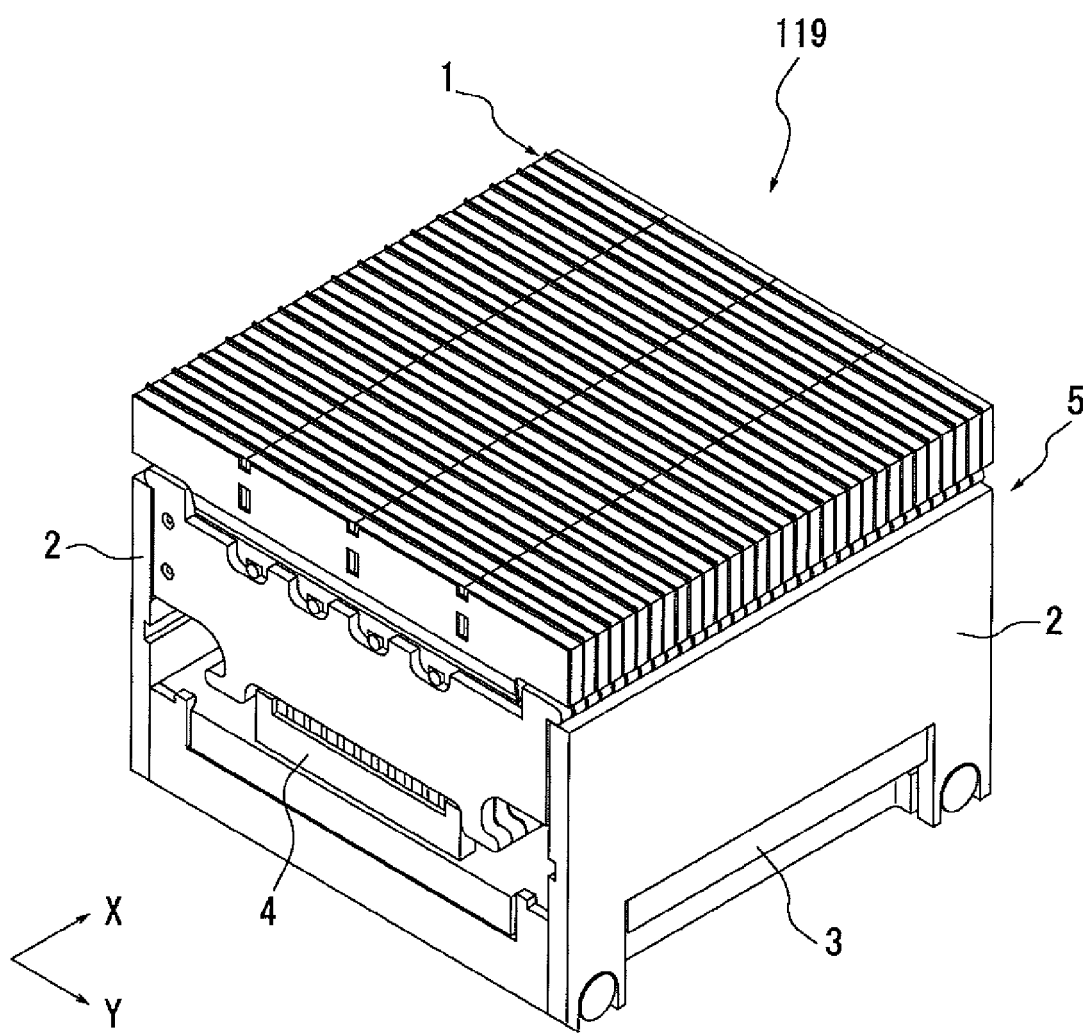
FIG. 3 is a perspective view of a radioactive ray detecting apparatus, according to the embodiment of the present invention.

FIG. 3 shows an example of a perspective view of the radioactive ray detecting apparatus according to the embodiment of the present invention.

The radioactive ray detector 1, for example, can be used as a radioactive ray detector 1 of a radioactive ray detecting apparatus 119, which is constructed by holding plural numbers of the radioactive ray detectors 1 with using a radioactive ray detector stand 5. As an example, it is possible to hold the plural numbers of radioactive ray detectors 1 on a radioactive ray detector stand 5, having plural numbers of supporting bodies 2, which are aligned at a predetermined distance corresponding to an interval of alignment of those plural numbers of supporting members 2 and are formed with plural numbers of grooves, into which the plural numbers of radioactive ray detectors 1 are inserted, a supporting bodies 3 for mounting the supporting members 2 thereon, and plural numbers of connectors 4, with which the card edge portions of the plural numbers of radioactive ray detectors 1 are connected, respectively, thereby to connect the external control circuit and the plural numbers of radioactive ray detectors 1, respectively. In FIG. 3 is shown an example, in which sixteen (16) pieces of radioactive ray detectors 1 are inserted into the radioactive ray detector stand 5, in the X-direction, thereby to be held therein. Also, in the elastic member mounting portion 32 and the concave portion 32a are installed spring members, being made of a metal plate, for example, and when the radioactive ray detectors 1 are inserted into the grooves of the supporting members 2, the radioactive ray detectors 1 are pushed onto the supporting members 2 by those spring members, and thereby being fixed with.

In the present embodiment, the plural numbers of radioactive ray detectors 1 are disposed along with the X-direction, to be aligned in a matrix manner in a plane view, and are constructed as one (1) set of the radioactive ray detecting apparatus 119. However, it is also possible to align the plural numbers of radioactive ray detectors 1 along with the Y-direction.

(Outlook of Alignment of Radioactive Ray Detectors)

Figure 4:
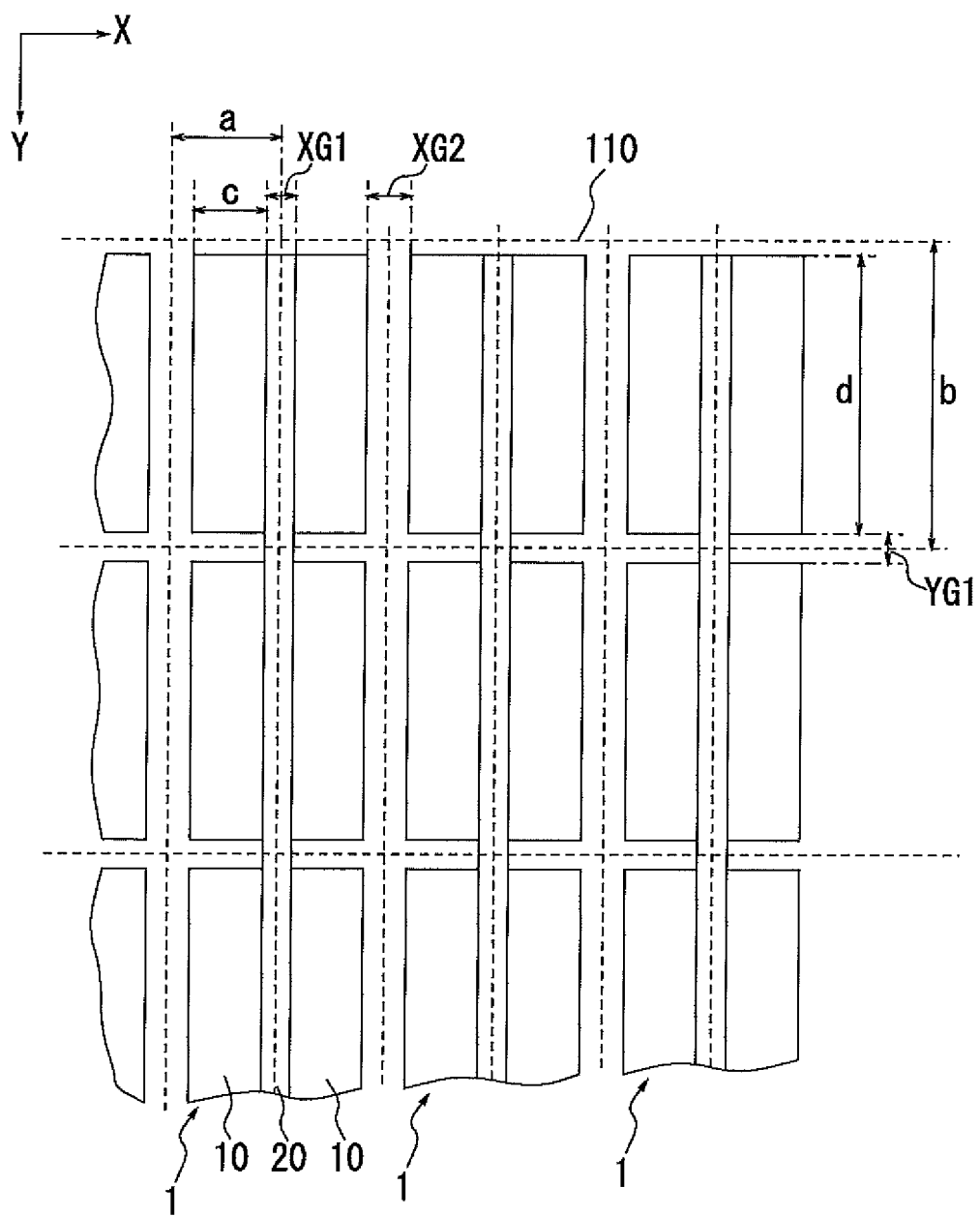
FIG. 4 is an outlook view for showing condition where plural numbers of the radioactive ray detectors are aligned, according to the embodiment of the present invention.

FIG. 4 shows a part of the outlook of condition where the plural numbers of radioactive ray detectors 1 are aligned, according to the present embodiment.

FIG. 4 is a view of seeing the plural numbers of radioactive ray detectors 1 from a side, upon which the radioactive rays are incident (i.e., an upper surface side), wherein illustration of the grooves of the semiconductor elements 10, the wiring patterns of the substrates 20 and the flexible substrate 40, etc., are omitted, for the purpose of convenience for explanation thereof.

In the present embodiment, the plural numbers of radioactive ray detectors 1 are aligned along with the X-direction in such a disposition that the respective substrates 20 of the plural numbers of radioactive ray detectors 1 are in parallel with. And, each of the plural numbers of radioactive ray detectors 1 has plural numbers of semiconductor elements 10, which are aligned in series in the Y-direction, on one surface and the other surface of the substrate, respectively.

Herein, it is assumed that a distance defined between the semiconductor elements 10, which are provided with putting the substrate 20 therebetween is "XG1", and a distance defined from the semiconductor element 10 of one (1) radioactive ray detector 1 up to the semiconductor element 10 of other radioactive ray detector 1, facing to that semiconductor element 1 and neighboring to the one (1) radioactive ray detector 1, is "XG2". Also, it is assumed that a distance defined between the semiconductor elements 10, which are aligned in the Y-direction, is "YG1", and further that a horizontal pitch and a vertical pitch of a predetermined semiconductor element pitch 110, to be used as the radioactive ray detector 1, are "a" and "b". Further, in FIG. 4, each one of oblongs, which are divided by broken lines, corresponds to the semiconductor element pitch 110.

Herein, respective sizes of the plural numbers of semiconductor elements 10, which the plural numbers of the radioactive ray detectors 1 have, are determined so that they satisfy the following four (4) relational expressions:

$c = a - (XG1 + XG2)/2$ $d = b - YG1 = 2e + (n-2)f$ $e = b/n - YG1/2$ $f = b/n$ (however, "$n$" is a positive integer)

Herein, in case where the matched collimator is provided above the radioactive ray detecting apparatus, aligning the plural numbers of the radioactive ray detectors 1 therein, it is preferable to adopt such a disposition that it satisfies the following relational expression. However, in the two (2) relational expressions, which will be given below, it is assumed that a scepter width of the matched collimator is "Cd". The scepter width is equal to or greater than 0.2 mm and equal to or greater than 0.3 mm, approximately, as an example. Also, "XG1" is equal to or greater than 0.18 mm and equal to or greater than 0.2 mm, approximately, and "XG2" is equal to or greater than 0.20 mm and equal to or greater than 0.24 mm, approximately, respectively.

$Cd \geq XG1$ $Cd \geq XG2$

Also, for the purpose of bringing the scepter width of the matched collimator to be coincident with the width of the dead areas or regions unable to detect the radioactive rays, which are defined between the radioactive ray detectors 1, respectively, due to existence of the substrate 20 of the radioactive ray detector 1, etc., or when the plural numbers of the radioactive ray detectors 1 are aligned, it is preferable to satisfy the relationship, i.e., XG1=XG2, and it is further preferable to satisfy the relationship, i.e., XG1=XG2=YG1.

FIG. 5 is diagrammatic upper view when the matched collimator is provided on the radioactive ray detectors, according to the present embodiment.

The matched collimator 50 is provided in such a manner that it covers one (1) or more numbers of the radioactive ray detecting apparatus(es), each being constructed by aligning the plural numbers of the radioactive ray detectors 1. And, in case where the matched collimator 50 is applied, it is required to keep correspondence between the positions of plural numbers of openings 51 of the matched collimator 50 and the positions of the plural numbers of intra-element pixel regions 10a of the semiconductor element 10, respectively. If they are out of this relationship of correspondence, the scepter 52 (being called, a "partition wall", sometimes) for separating the plural numbers of openings 51 of the matched collimator 50 results to position at the position of the intra-element pixel region 10a. In this case, the area or region where the intra-element pixel region 10a and the scepter file up with results into the dead areas or regions unable to detect the radioactive rays.

Then, the sizes of the plural numbers of the semiconductor elements 10 are determined, so that they satisfy the four (4) pieces of the relational expressions mentioned above; i.e., $c = a - (XG1 + XG2)/2$ $d = b - YG1 = 2e + (n-2)f$ $e = b/n - YG1/2$ $f = b/n$ (however, "$n$" is a positive integer)

and, the plural numbers of the radioactive ray detectors 1 are alighted; therefore, it is possible to keep the correspondence between the unavoidable deal regions included within the plural numbers of the radioactive ray detectors 1 (for example, the area or region where the electrode(s) of the semiconductor element 10 lie(s), the area or region where the wiring pattern(s) of the substrate 20 lie(s), the area or region where the substrate 20 lies, the area or region defined between one radioactive ray detector 1 and other radioactive ray detector 1, neighboring with that one radioactive ray detector, etc.), and the positions of scepters 52.

Effect(s) of Embodiment

With the radioactive ray detector 1, according to the present embodiment, since the sizes of the semiconductor elements 10 are determined in accordance with the specific relational expressions and also the width of the intra-element pixel region 10a is determined, then it is possible to bring the dead region caused due to the radioactive ray detector 1 to be coincident with the width of the scepter 52 of the matched collimator 50, easily. With this, since the dead region can be reduced, therefore it is possible to reduce the dead regions as a whole even in case where the radioactive ray detectors 1 are disposed dense or crowded, and to provide the radioactive ray detecting apparatus equipped with the radioactive ray detectors 1 having high sensitivity of radioactive rays.

Also, the radioactive ray detector 1 according to the present embodiment is an Edge-On type, and it is not necessary to manufacture a planner-shaped semiconductor element, which is relatively large in a plane size thereof. Accordingly, with the present embodiment, comparing to the case of manufacturing the planner-shaped semiconductor element, the semiconductor element 1 of more homogeneous crystallization can be obtained at high yield rate; therefore, it is possible to reduce the manufacturing costs of the radioactive ray detectors 1. Also, since radioactive ray detector 1 is the Edge-On type, there is no necessity of small pixel effect and co-planner grid technologies, i.e., there can be also obtained an advantage that there is no Charge shoring accompanying with small pixel effect.

Also, because of the radioactive ray detector 1 of the Edge-On type, the distance between the electrodes does not change even if heightening the height "h" of the semiconductor 1 (i.e., deepening the depth, into which the radioactive rays can travel), then reduction of charge correcting efficiency is small. With this, for the radioactive ray detector 1 according to the present embodiment, it is possible to detect the gamma (γ) rays of high energy at high efficiency. Further, an example of nuclear species of radioactive rays to be applied into a gamma camera, etc., in the radioactive ray detecting apparatus equipped with the radioactive ray detectors 1 according to the present embodiment are shown in a table 1.

TABLE 1

| Nuclear Species | Energy (keV) |
|---|---|
| $^{201}Tl$ | 72, 135, 167 |
| $^{99m}Tc$ | 140 |
| $^{123}I$ | 159 |
| $^{133}Xe$ | 81 |
| $^{67}Ga$ | 93, 185, 300 |
| $^{111}In$ | 173, 247 |
| $^{131}I$ | 365 |

Although the explanation was given on the embodiment(s) of the present invention in the above, but the embodiment(s) mentioned above does not limit the preset invention defined in the patent claims. Also, it should be noted that all of the combinations of the features, which are explained in the embodiment(s), are not necessarily essential to the means for solving the problem(s) of the invention.

USABILITY ON INDUSTRY

It is possible to provide the radioactive ray detecting apparatus for enabling to reduce the dead area or region where the radioactive rays cannot be detected, even if disposing the radioactive ray detectors to be dense or crowded.

EXPLANATION OF MARKS

1 . . . radioactive ray detector
2 . . . supporting member
3 . . . supporting member
4 . . . connector
10 . . . semiconductor element
10a . . . intra-element pixel regions
10b . . . groove
10d . . . element surface
20 . . . substrate
22 . . . substrate terminal
29 . . . card edge portion
29a . . . pattern
30, 31 . . . card holder
32 . . . elastic member mounting portion
32a . . . concave portion
34 . . . hole with groove
36 . . . projecting portion
40 . . . flexible substrate
50 . . . matched collimator
51 . . . opening
52 . . . scepter
100 . . . radioactive ray
110 . . . semiconductor element pitch
119 . . . radioactive ray detecting apparatus

What is claimed is:

1. A radioactive ray detecting apparatus equipped with Edge-On type radioactive ray detectors, each having a substrate, on which plural numbers of semiconductor elements enabling to detect radioactive rays are fixed, wherein
each of said plural numbers of semiconductor elements has plural numbers intra-element pixel regions on a surface thereof, on which said radioactive rays are incident,
said plural numbers of radioactive ray detectors are aligned along with an X-direction in such disposition that said substrates of the plural numbers of radioactive ray detectors are in parallel with, respectively, when defining said X-direction and a Y-direction on a plane view,
each of said radioactive ray detectors has said plural numbers of semiconductor elements, which are aligned in said Y-direction, respectively, on one surface and other surface of said substrate,
when assuming that distance between said semiconductor elements, being provided with putting said substrate therebetween, is "XG1", while distance from said semiconductor element of one of said radioactive ray detectors up to said semiconductor element of other radioactive ray detectors, facing to said semiconductor element and neighboring with said one radioactive ray detector, is "XG2", and
distance between said semiconductor elements alighted in said Y-direction is "YG1", and further assuming that a horizontal pitch of a predetermined pixel pitch to be used as said radioactive ray detector is "a" and a vertical pitch thereof is "b", width of a surface of each of said plural numbers of semiconductor elements, upon which the radioactive rays are incident, is "c" and length thereof is "d", and among said plural numbers of intra-element pixel regions of respective one of said plural numbers of semiconductor elements, assuming that length of the intra-element pixel regions, which are positioned at both end portions of respective one of said plural numbers of semiconductor elements, is "e", respectively, and length of each one of said plural numbers of intra-element pixel regions, being put between the intra-element pixel regions, which are positioned at both end portions of each of said plural numbers of semiconductor elements, is "f", respectively, the following relationships are satisfied:

$c = a - (XG1 + XG2)/2$ $d = b - YG1 = 2e + (n-2)f$ $e = b/n - YG1/2$ $f = b/n$ (however, "$n$" is a positive integer).

2. The radioactive ray detecting apparatus, as described in the claim 1, wherein the following relationships are satisfied:

$Cd \geq XG1$ $Cd \geq XG2$ when assuming that scepter width of a matched collimator, which can be provided on the radioactive ray detector, is "Cd".

3. The radioactive ray detecting apparatus, as described in the claim 1, wherein the relationship XG1=XG2 is satisfied.

4. The radioactive ray detecting apparatus, as described in the claim 1, wherein the relationship XG1=XG2=YG1 is satisfied.

5. The radioactive ray detecting apparatus, as described in the claim 1, wherein each of said plural numbers of semiconductor elements has (n−2) pieces of grooves on a surface perpendicular to the surface, upon which said radioactive rays are incident, and also has an electrode, between said plural numbers of grooves, and on a surface opposite to said one surface, and thereby defining n pieces of said intra-element pixel regions.

6. The radioactive ray detecting apparatus, as described in the claim 1, wherein said plural numbers of semiconductor elements are provided on one surface of said substrate and on other surface thereof, respectively, with using said substrate as a symmetric surface.

* * * * *